US012567461B2

(12) United States Patent
Pulluru et al.

(10) Patent No.: US 12,567,461 B2
(45) Date of Patent: Mar. 3, 2026

(54) MEMORY DEVICE AND OPERATION TO REDUCE IMPACT OF PARASITIC WIRE RESISTANCE AND CAPACITANCE

(71) Applicant: Samsung Electronics Co., Ltd., Suwon-si (KR)

(72) Inventors: Lava Kumar Pulluru, Bengaluru (IN); Manish Chandra Joshi, Bengaluru (IN); Parvinder Kumar Rana, Bengaluru (IN); Poornima Venkatasubramanian, Bengaluru (IN); Ved Prakash, Bengaluru (IN); Chaitanya Vavilla, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 157 days.

(21) Appl. No.: 18/378,598

(22) Filed: Oct. 10, 2023

(65) Prior Publication Data

US 2024/0347104 A1    Oct. 17, 2024

(30) Foreign Application Priority Data

Mar. 24, 2023    (IN) .............................. 202341021248

(51) Int. Cl.
G11C 11/419        (2006.01)
(52) U.S. Cl.
CPC ................................. G11C 11/419 (2013.01)

(58) Field of Classification Search
None
See application file for complete search history.

(56) References Cited

U.S. PATENT DOCUMENTS

| | | | |
|---|---|---|---|
| 6,341,095 B1 | 1/2002 | Lee et al. | |
| 8,675,427 B2 | 3/2014 | Behrends et al. | |
| 2014/0112064 A1* | 4/2014 | Adams | ..................... G11C 7/12 365/154 |
| 2021/0082490 A1 | 3/2021 | Ramaraju | |

OTHER PUBLICATIONS

A. Nalamalpu, et. al., "Boosters for driving long onchip interconnects— design issues, interconnect synthesis, and comparison with repeat- ers," IEEE Transactions on Computer-Aided Design of Integrated Circuits and Systems, Jan. 2002, pp. 50-62, vol. 21, No. 1.

* cited by examiner

*Primary Examiner* — Alfredo Bermudez Lozada
(74) *Attorney, Agent, or Firm* — Muir Patent Law, PLLC

(57) ABSTRACT

A memory device and its operation reduce the impact of a parasitic wire Resistance and Capacitance (RC) in the memory device. At least one of a rise transition and a fall transition of a signal transmitted by a long metal line is sensed by a sense circuit of a signal boosting circuit. At least one of a Pull Up (PU) circuit and a Pull Down (PD) circuit of the signal boosting circuit is enabled to speed-up one or both of the rise transition and the fall transition of the signal transmitted by the long metal line. The duration of an operation of one of the PU circuit and the PD circuit may be controlled using a control signal.

20 Claims, 10 Drawing Sheets

FIG. 9

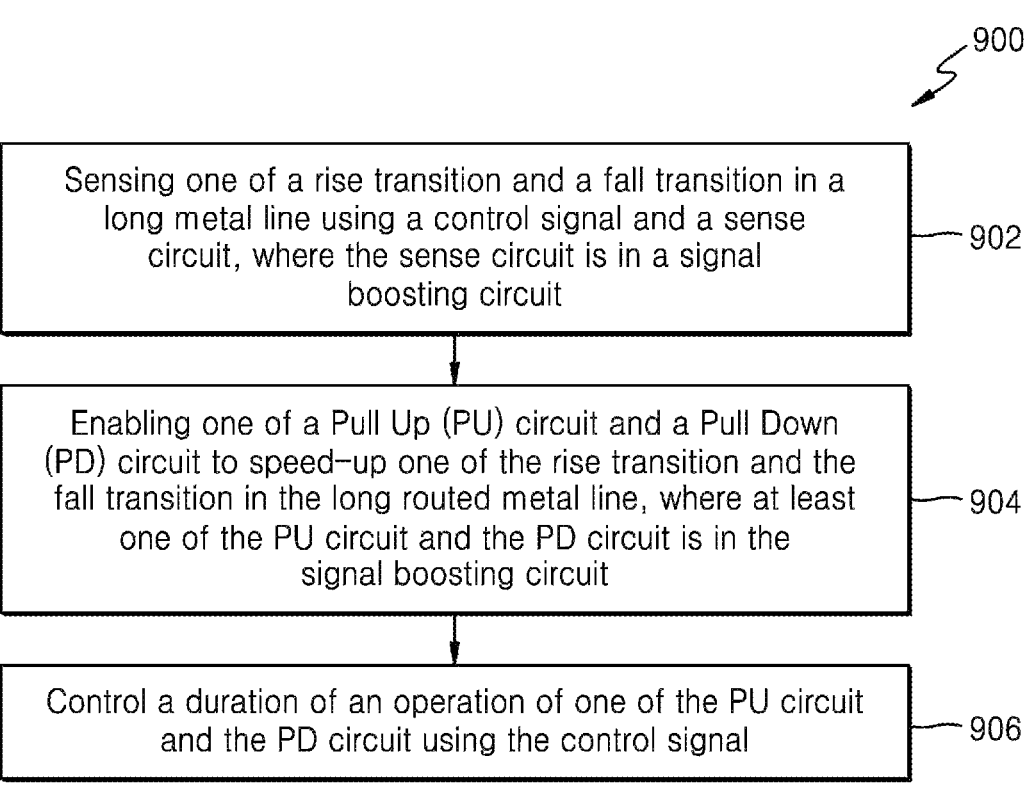

900

Sensing one of a rise transition and a fall transition in a long metal line using a control signal and a sense circuit, where the sense circuit is in a signal boosting circuit — 902

Enabling one of a Pull Up (PU) circuit and a Pull Down (PD) circuit to speed-up one of the rise transition and the fall transition in the long routed metal line, where at least one of the PU circuit and the PD circuit is in the signal boosting circuit — 904

Control a duration of an operation of one of the PU circuit and the PD circuit using the control signal — 906

INV

MEMORY DEVICE AND OPERATION TO REDUCE IMPACT OF PARASITIC WIRE RESISTANCE AND CAPACITANCE

TECHNICAL FIELD

The present disclosure relates to a field of memory device operation managing methods and circuits, and more particularly to methods and circuits for reducing impact of a parasitic wire Resistance and Capacitance (RC) in a memory device.

BACKGROUND

In reading data from memory using a single ended signal, read operations may be performed through a discharge and/or pre-charge of a long metal line (e.g., a long global bitline (GRBL) or the like). The time required for the discharge and the pre-charge of a long metal line limits memory performance.

FIG. 1 illustrates a circuit diagram of a read port circuit for a single ended global read bit line (GRBL) of according to a conventional art memory device, such a SRAM (100). The GRBL may transmit a binary digital signal—having a logic low and logic high states—in a single ended manner (i.e., only a single conductive wire (GRBL) is used to transmit the binary signal). Logic high and logic low may be referenced herein as '1' and '0' respectively and may be represented respectively by a relatively high operating voltage (such as a supply voltage VDD or relatively close to the supply voltage (e.g., VDD—a threshold voltage drop of a transistor) and a relatively low reference voltage (e.g., ground, VSS, etc.). The binary signal may be a data signal transmitting a bit of data read from a memory cell of the memory device. In this SRAM (100), two port memory cells have dedicated read port transistors which drive a local read bitline. The local read bitline is segmented and connected to the read port transistors of all rows of a bank. The local bitlines from plural banks are sensed using NAND gates (e.g., 102a 102b). A NAND gate output drives a global read bitline (GRBL) through a pull down transistor. The GRBL is not segmented (i.e., it is a continuously formed wire forming a single electrical node) and is connected to multiple pull down transistors associated with the plural banks.

As shown in FIG. 1, a read port of a memory cell (e.g., a memory cell storing a bit of data) comprises two series connected transistors (if FIG. 1, a M7 NMOS transistor and a M8 NMOS transistor). Depending on the data of the memory cell being read, the read port of that memory cell may pull down a read bitline (RBL) which is connected to all the memory cells of a bank. It will be understood that when an element is referred to as being "connected" or "coupled" to or "on" another element, it can be directly connected or coupled to or on the other element or intervening elements may be present. During default state prior to accessing a memory cell, RBL is pre-charged to VDD using the PCH signal.

In general, each bank has a plurality of word lines, with each word line connected to a plurality of memory cells (not shown) (a row, or row of memory cells). When a word line is selected for reading, a corresponding access signal is provided to the corresponding read word line (RWL). In general, a read word line RWL is 0 during a standby mode and becomes 1 when corresponding to the selected row during a read operation. The PCH signal is 0 during standby mode (connecting VDD to RBL through the corresponding PMOS transistor) and 1 during the read operation of that bank (disconnecting VDD from RBL of the bank in which the read operation is performed). As will be understood, reference to lines, nodes, etc. having or at a "0" and "1" in this disclosure correspond to logic levels. For example, "0" may refer to a low logic level, such as a reference level (e.g., VSS, ground, etc.) and "1" may refer to high logic level of a positive voltage, such as a supply voltage VDD. A "0" (e.g., a reference voltage) applied to a gate of an NMOS transistor may be insufficient to turn on the NMOS transistor, while a "1" (e.g., a supply voltage VDD) applied to a gate of a NMOS transistor may be sufficient to turn on the NMOS transistor. In contrast, a "0" (e.g., a reference voltage) applied to a gate of an PMOS transistor may be sufficient to turn on the PMOS transistor, while a "1" (e.g., a supply voltage VDD) applied to a gate of a PMOS transistor may be sufficient to turn on the NMOS transistor. This is a simplistic description for purposes of describing the operation, and it will be understood that other factors are involved in determining an on/off state of a transistor (e.g., relative voltages applied to its drain and source), and other voltages may be considered a logic "0" and logic "1" (and may control the on/off state of a transistor).

In an example, reading a memory cell storing a data bit of 1 may provide an output of 0 at Qb (a "read 1 operation"). After precharging a read bit line RBL to VDD, for a memory cell of a selected word line, consider, Qb=0 (corresponding the data bit of 1 output by the memory cell), read wordline (RWL)=1 (of the corresponding selected word line, e.g., RWL (N)), and bitline precharge (PCH)=1 in the circuit (100). In this instance M7 is ON and M8 is OFF and the pre-charge voltage VDD is cut off and not connected to the read bitline RBL. Further, although other non-selected word lines of the bank may have their corresponding read word lines RWL set to 0 (VSS), due to leakage to through the corresponding M7 NMOS transistor and the M8 NMOS transistor in every row of a bank, a read bit line (RBL) can discharge below a trigger point of the sensing NAND gate (e.g., 102a). When the RBL discharges below the trigger point of NAND gate (102a or 102b), this leads to incorrectly reading the data of the memory cell (i.e., detecting Qb as 1 rather than 0). Further, the discharge duration of RBL is determined by a pulse width of RWL/PCH. Hence, a dip may be observed in the RBL due to leakage during a read 1 operation. Further, an input voltage at which output of the NAND gate flips, so that the value of the read 1 margin corresponds to a NAND DIP subtracted from a NAND FLIP voltage. In general, the RBL is pre-charged to VDD at the end of every read operation and remains pre-charged at VDD during standby mode. As explained above, the NAND DIP voltage heavily depends on leakage of M7 NMOS transistor and M8 NMOS transistor.

During a read 0 operation (e.g., of a memory cell storing a data bit of 0), after precharging RBL and GRBL, Qb=1, RWL=1 and PCH=1. Thus, RBL discharges to 0 and makes the NAND gate (e.g. 102a) output 1, turning on transistor M0 to discharge Global Read Bitline (GRBL) to 0 (transistor M0 connecting GRBL to ground). In other words, during the read 0 operation, the MOS (M7) and MOS (M8) are ON (of the corresponding word line and memory cell) and RBL is discharged from the initial state of VDD to 0. During the read 0 operation, RBL discharges to 0 and during read 1, the RBL is undriven (e.g., floating at the initial state of VDD). Further, during the read 0 operation, GRBL discharges to ground and is sensed by a tristate buffer. At the end of the read operation, the GRBL is pre-charged to 1. As will be appreciated, the GRBL discharge/pre-charge time is heavily impacted by the parasitic wire-RC of GRBL.

OBJECTS

The principal object of the embodiments herein is to disclose methods and circuits for reducing impact of a parasitic wire Resistance and Capacitance (RC) in a memory device. In order to reduce an impact of the parasitic wire RC, a signal boosting circuit is introduced at a portion (e.g., middle portion or the like) of the long routed metal line length (e.g., GRBL wire length). The signal boosting circuit senses the rise/fall transition in GRBL wire and enables a stronger PU/PD circuit to speed-up the rise/fall transition. The signal boosting circuit also receives an additional control signal to control PU/PD circuit. The additional control signal helps in avoiding contention between actual circuit with the signal boosting circuit.

Another object of the embodiments herein is to improve the discharge/pre-charge time of GRBL using the signal boosting circuit.

SUMMARY

Embodiments herein disclose methods and devices with reduced impact of a parasitic wire resistance and capacitance (RC) in a memory device. The method includes sensing at least one of a rise transition and a fall transition of a signal in a long metal line using a control signal and a sense circuit. The sense circuit may be part of a signal boosting circuit. Further, the method includes enabling one of a Pull Up (PU) circuit and a Pull Down (PD) circuit to speed-up one of the rise transition and the fall transition of the signal being transmitted by the long metal line. At least one of the PU circuit and the PD circuit may be provided with the signal boosting circuit. The duration of an operation of one of the PU circuit and the PD circuit may be controlled using a control signal.

These and other aspects of the invention disclosed herein will be better appreciated and understood when considered in conjunction with the following description and the accompanying drawings. It should be understood, however, that the following describes example embodiments and numerous specific details by way of illustration and not of limitation. Many changes and modifications may be made to the disclosed example embodiments herein without departing from the scope and spirit of the invention.

BRIEF DESCRIPTION OF FIGURES

Embodiments herein are illustrated in the accompanying drawings, throughout which like reference letters indicate corresponding parts in the various figures. The embodiments herein will be better understood from the following description with reference to the drawings, in which:

FIG. 9 is a flow chart illustrating a method according to an embodiment as disclosed herein.

DETAILED DESCRIPTION

Figure 1:
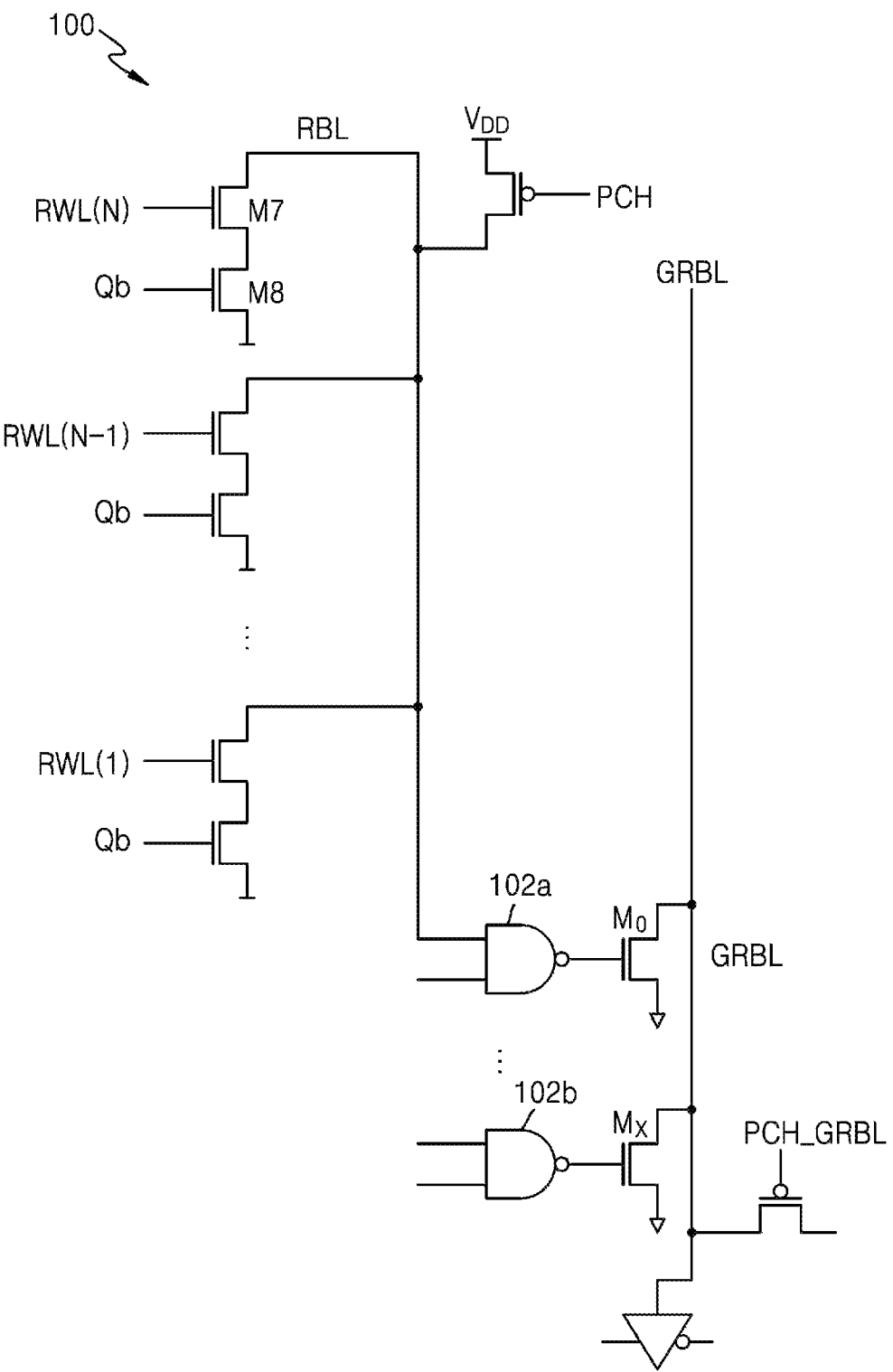
FIG. 1 illustrates a circuit diagram of a read port circuitry for a single ended signal.

The example embodiments herein and the various features and advantageous details thereof are explained more fully with reference to the non-limiting embodiments that are illustrated in the accompanying drawings and detailed in the following description. Descriptions of details and operations well-known components may be omitted so as to not unnecessarily obscure the embodiments herein. The description herein is intended merely to facilitate an understanding of ways in which the example embodiments herein can be practiced and to further enable those of skill in the art to practice the example embodiments herein. Accordingly, this disclosure should not be construed as limiting the scope of the invention disclosed herein.

The embodiments herein achieve methods for reducing impact of a parasitic wire RC in a memory device. The memory device may be an integrated circuit formed as a semiconductor chip. The method includes sensing one of a rise transition and a fall transition in a long metal line using a sense circuit. The sense circuit may be part of a signal boosting circuit. The method may include enabling one of a PU circuit and a PD circuit to speed-up one of the rise transition and the fall transition in the long metal line. At least one of the PU circuit and the PD circuit may be part of the signal boosting circuit. Further, in some examples, the method includes controlling a duration of an operation of one of the PU circuit and the PD circuit using a control signal, such as when no transition in the long metal line is detected.

Unlike conventional methods and systems, in order to reduce the impact of the parasitic wire RC, the signal boosting circuit is introduced at a portion (e.g., middle portion or the like) of the long metal line. The signal boosting circuit senses the rise/fall transition in the long metal line (e.g., GRBL wire or the like) and enables a stronger PU/PD circuit to speed-up the rise/fall transition. The signal boosting circuit may receive a control signal to control a PU/PD circuit when no transition in long metal line is detected. The control signal may help in avoiding contention between actual circuit with the signal boosting circuit.

The embodiments can be used to improve the discharge/pre-charge time of the long metal line using the signal boosting circuit. The embodiments can be used to improve performance in a memory, such as an SRAM, DRAM, a read only memory (ROM), etc.

Referring now to the drawings, and more particularly to FIGS. 2 through 9, where similar reference characters denote similar or same elements throughout the figures, there are shown example embodiments. It will be appreciated that the wiring reference characters used herein may identify both the physical wiring of the device as well as the signals (including the voltage levels at particular instances) being transmitted by such wiring.

Figure 2:
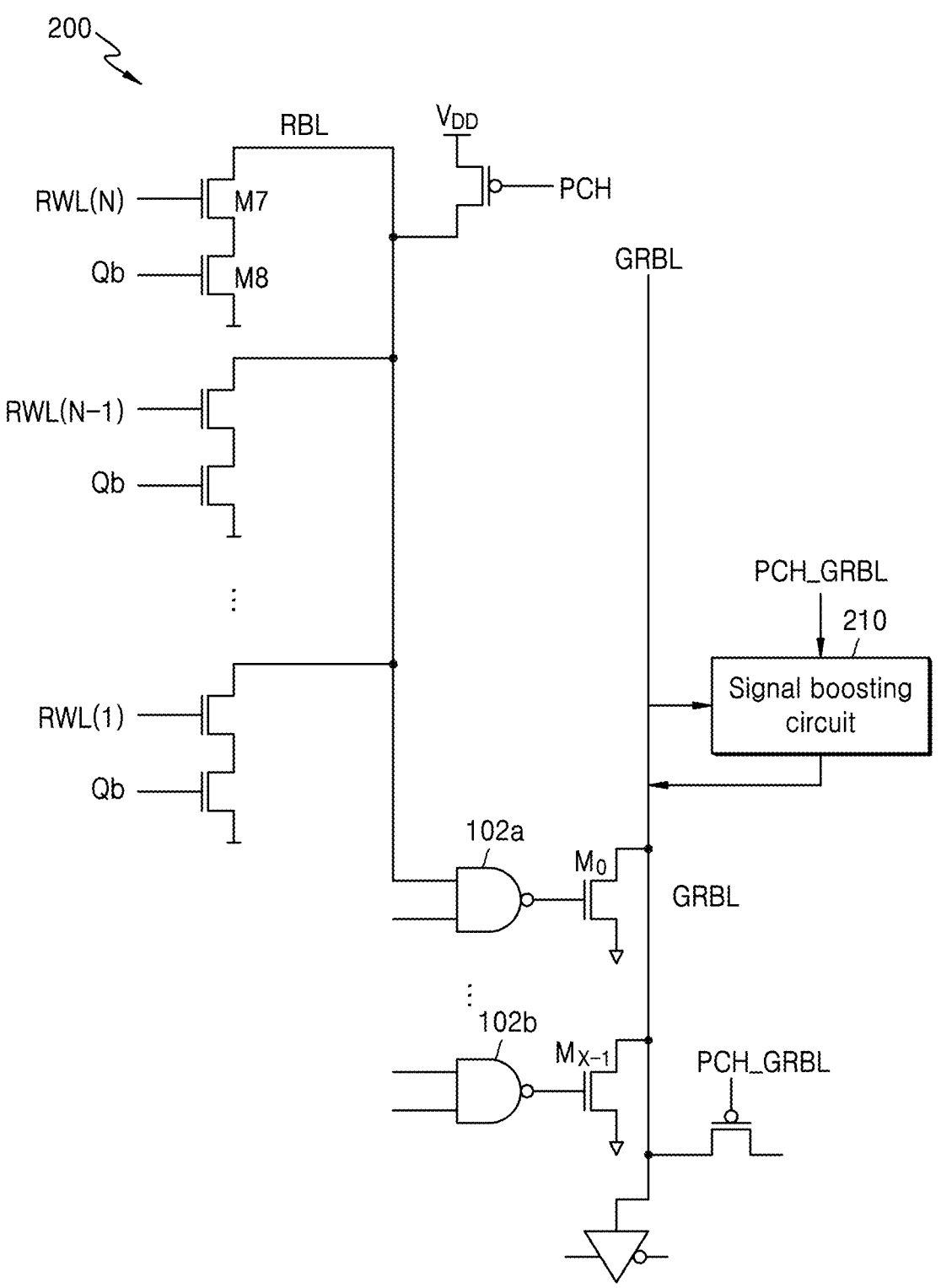
FIG. 2 shows a circuit diagram of a circuit for reducing impact of a parasitic wire RC in a memory device using a signal boosting circuit, according to an embodiment as disclosed herein.
Figure 3:
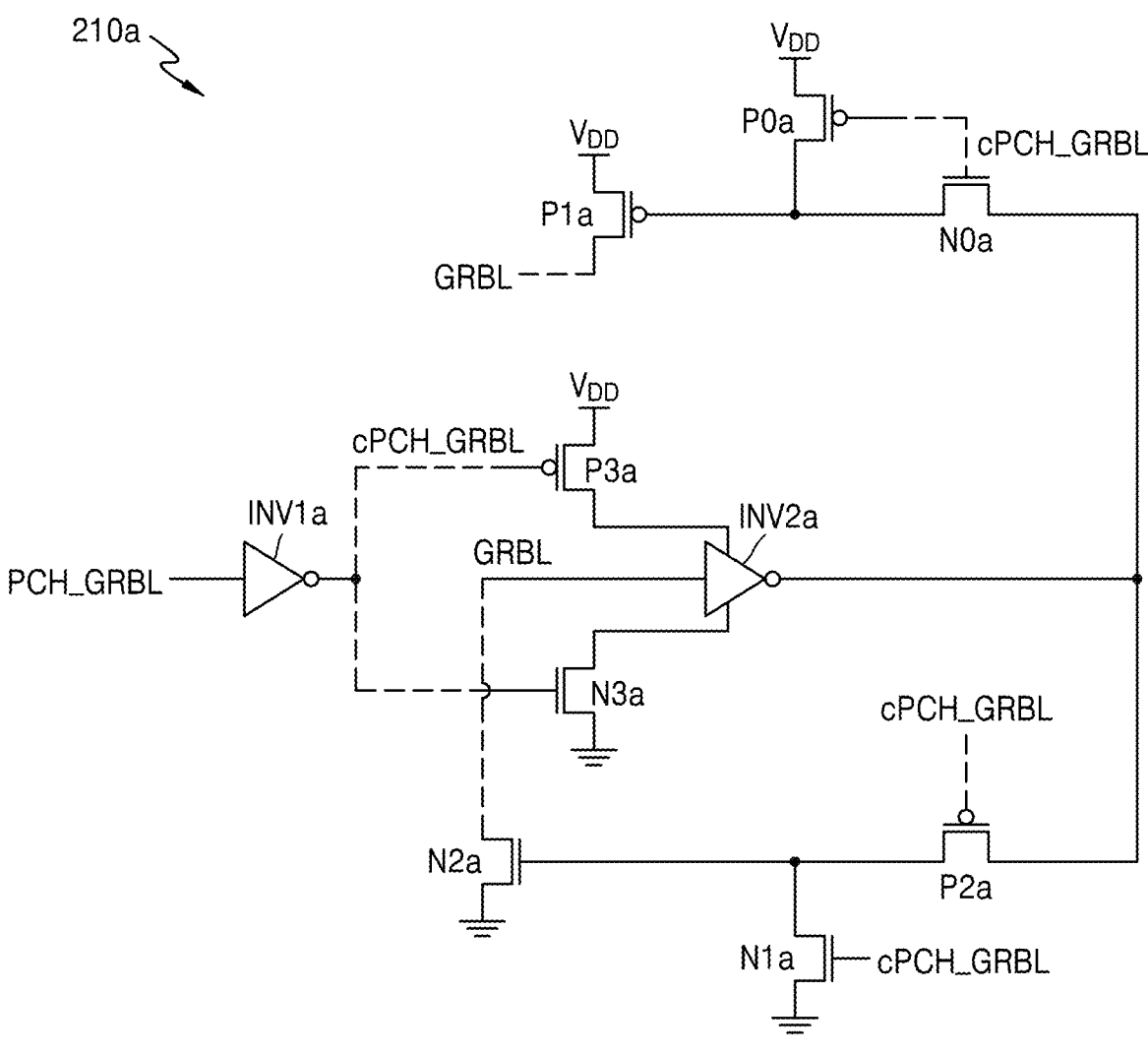
FIG. 3 shows a circuit diagram of a signal boosting circuit, according to an embodiment as disclosed herein.
Figure 4:
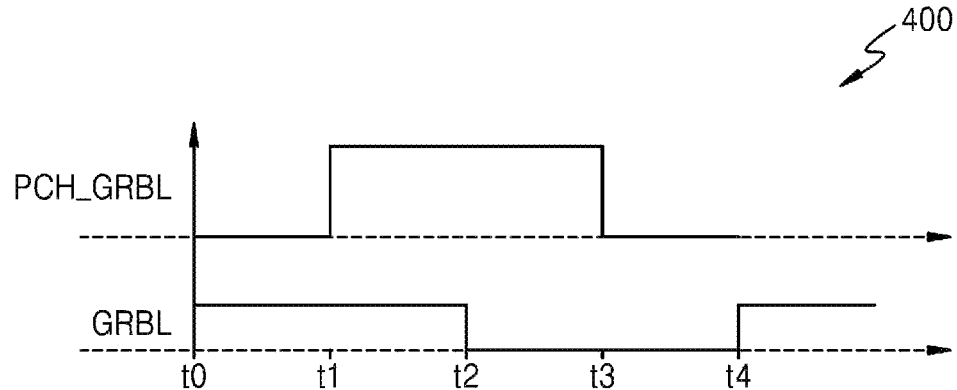
FIG. 4 shows a timing diagram of PCH_GRBL and GRBL input to the signal boosting circuit (of FIG. 3, according to an embodiment as disclosed herein.
Figure 5:
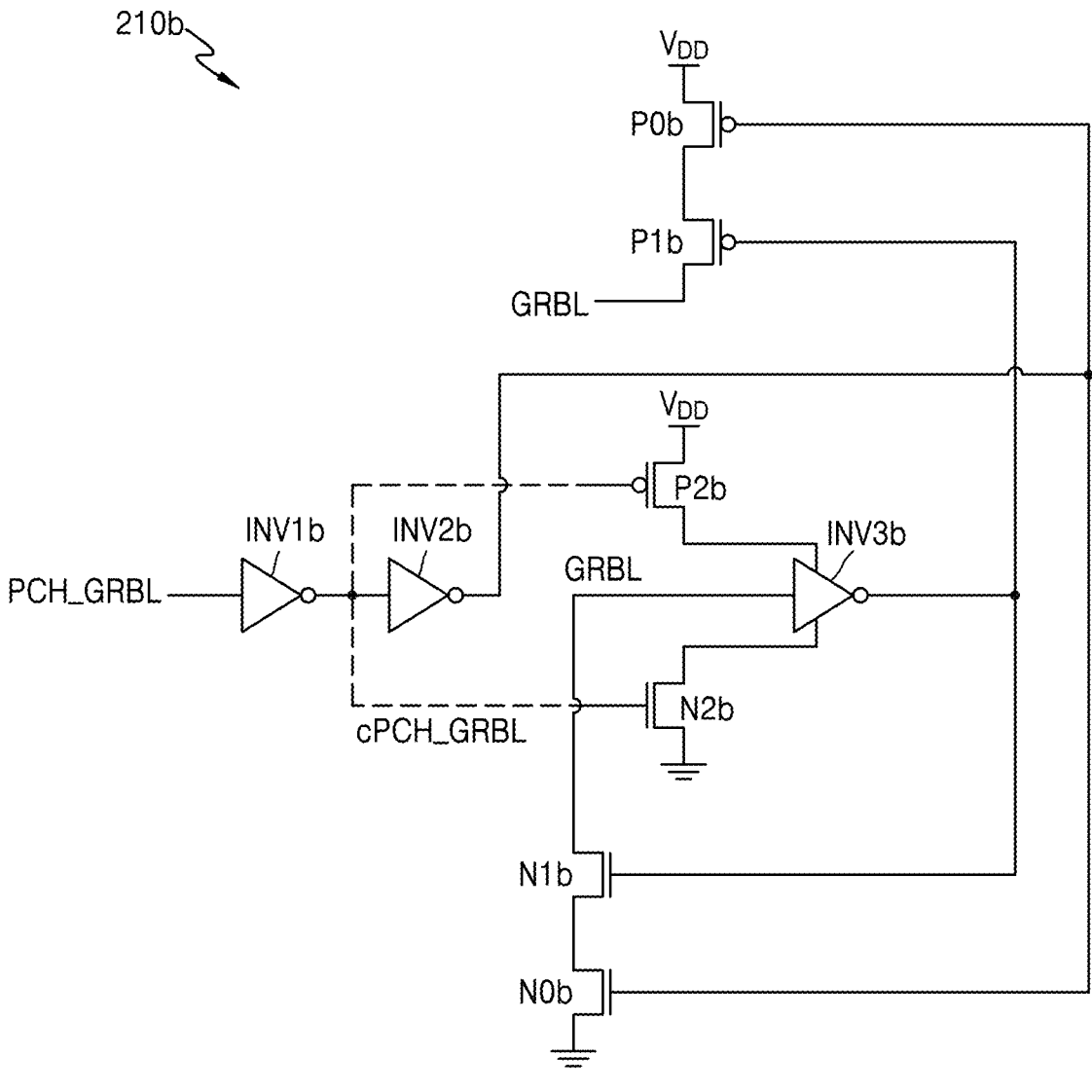
FIG. 5 shows another circuit diagram of a signal boosting circuit, according to an embodiment as disclosed herein.
Figure 6:
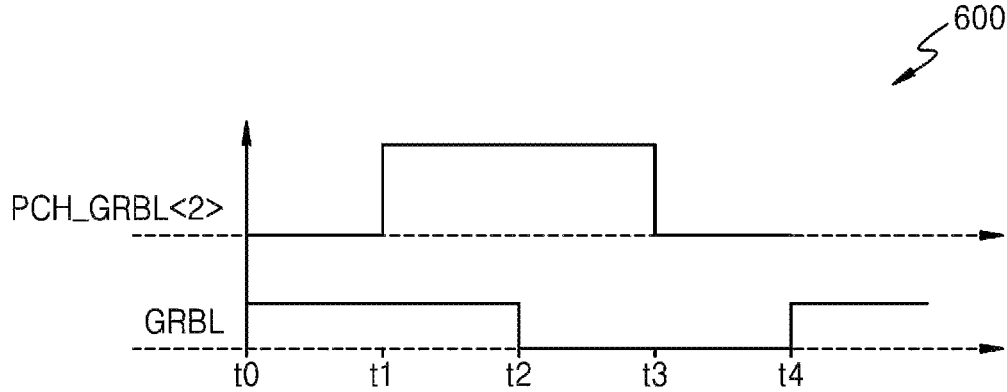
FIG. 6 shows another timing diagram of PCH_GRBL and GRBL input to the signal boosting circuit of FIG. 5, according to an embodiment as disclosed herein.
Figure 7:
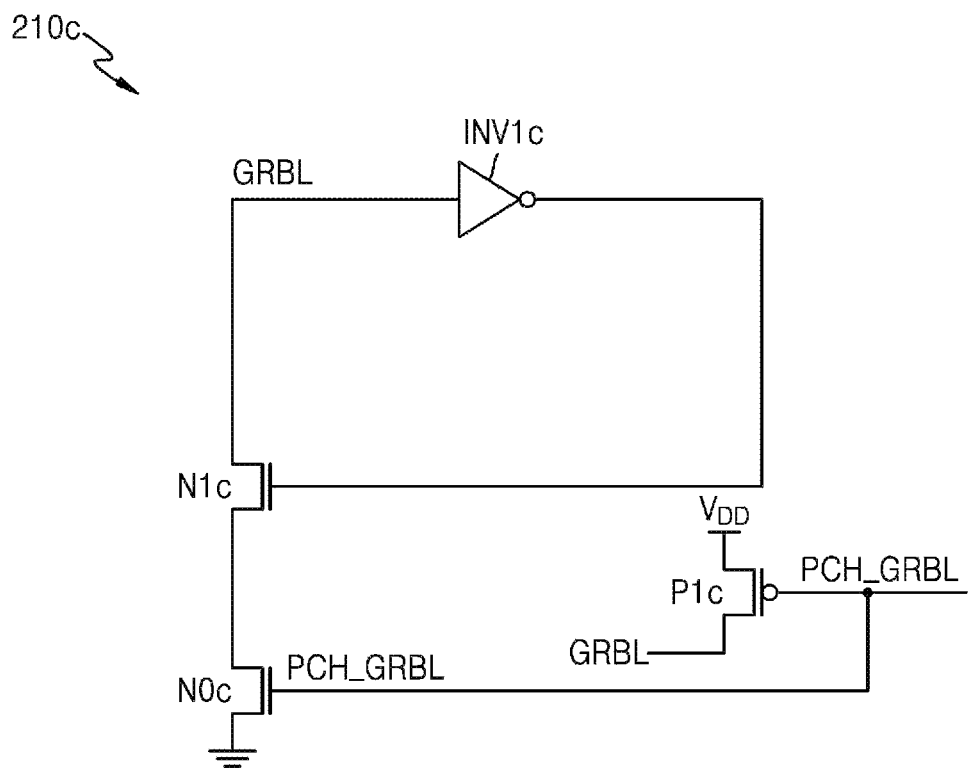
FIG. 7 shows another circuit diagram of a signal boosting circuit, according to an embodiment as disclosed herein.
Figure 8:
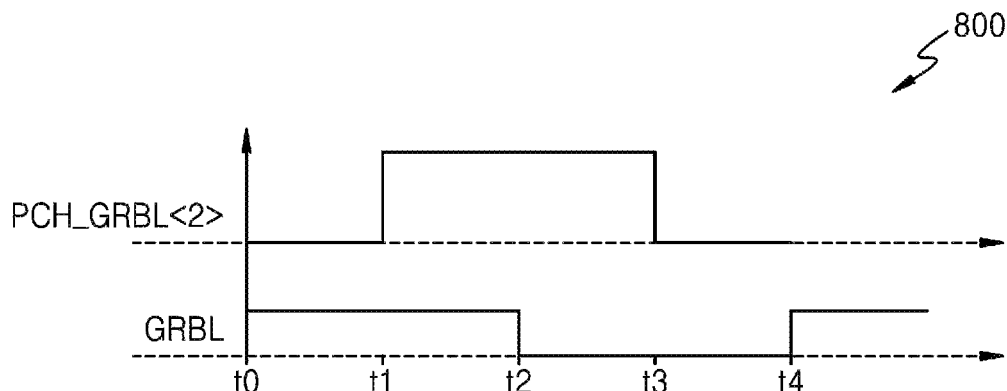
FIG. 8 shows another timing diagram of PCH_GRBL and GRBL provided to the signal boosting circuit of FIG. 7, according to an embodiment as disclosed herein.

FIG. 2 shows a circuit diagram of a circuit 200 for reducing impact of a parasitic wire RC in the memory device using a signal boosting circuit 210 according to embodiments. It should be appreciated that the structure and operation described with respect to FIG. 1 may be the same as that of FIG. 2 (except for the effects of the signal boosting provided with FIG. 2). FIG. 3, FIG. 5 and FIG. 7 illustrate exemplary details of signal boosting circuit 210, respectively as signal boosting circuits 210a, 210b and 210c. FIG. 3 shows a circuit diagram of the signal boosting circuit 210a, according to an embodiment as disclosed herein. FIG. 4 shows a timing diagram 400 of a PCH_GRBL and GRBL of the signal boosting circuit 210a, according to an embodiment as disclosed herein. FIG. 5 shows another circuit diagram of the signal boosting circuit 210b, according to an embodiment as disclosed herein. FIG. 6 shows another timing diagram 600 of a PCH_GRBL and GRBL of the signal boosting circuit 210b, according to an embodiment as disclosed herein. FIG. 7 shows another circuit diagram of the signal boosting circuit 210c, according to an embodiment as disclosed herein. FIG. 8 shows another timing diagram 800 of a PCH_GRBL and GRBL of the signal boosting circuit 210c, according to an embodiment as disclosed herein.

The signal boosting circuit 210 is configured to sense one of a rise transition and a fall transition in the long metal line using a sense circuit, where the sense circuit is placed in the signal boosting circuit 210. In the example of FIG. 3, the sense circuit is formed by a PMOS transistor (P3a), an NMOS transistor (N3a) and an inverter (INV2a). The long metal line can be, for example, but not limited to a Global Read Bit Line (GRBL), a WordLine (WL), a Bitline (BL), a Clock Signal (CLK), a Pre-charge signal (PCH), and a sense enable signal line (SAEN). In the present disclosure, reference simply to PMOS and NMOS refers respectively to a PMOS transistor and an NMOS transistor. The operations of the proposed method are explained in the context of the GRBL, but it is not limited to the GRBL. It is also applicable to the WL, the BL, the CLK, the PCH, and the SAEN. In an embodiment, the signal boosting circuit 210 is placed at and connected to the long metal line at a middle part of the long metal line (for example). The placement location may be determined based on the circuit requirements.

Further, the circuit 200 is configured to enable at least one of a Pull Up (PU) circuit and a Pull Down (PD) circuit to speed-up one of the rise transition and the fall transition in the long metal line, wherein at least one of the PU circuit and the PD circuit is placed in the signal boosting circuit 210. In an example, an NMOS transistor (N2a) is the PD circuit and a PMOS transistor (P1a) is the PU circuit in FIG. 3. In another example, PMOS transistors (P0b and P1b) form the PU circuit and NMOS transistors (N0b and N1b) form the PD circuit in FIG. 5. In another example, a PMOS transistor (P1c) is the PU circuit and NMOS transistors (N0c and N1c) form the PD circuit in FIG. 7. Further, the circuit 200 may be configured to control a duration of an operation of one of the PU circuit and the PD circuit using the control signal, such as when no transition in the long metal line is detected.

According to the embodiment of FIG. 3, the signal boosting circuit 210a includes inputs of the GRBL (at inverter INV2) and a control signal (PCH_GRBL), where the control signal (PCH_GRBL) controls a duration for which the signal boosting circuit 210a is enabled. The signal boosting circuit 210a also has outputs at drains of PMOS transistor (P1) and NMOS transistor (N1) selectively connecting GRBL to VDD and ground (a discharge node), respectively.

As shown in FIG. 3, the signal boosting circuit 210a includes a PMOS (P0a) including a drain connected with a gate of the PMOS (P1a), where a gate of the PMOS (P0a) is connected with a gate of an NMOS (N0a) and a gate of the PMOS (P1a) is connected with a source of the NMOS (N0a). A first inverter (INV1a) receives an input as the PCH_GRBL, where an output of the first inverter (INV1a) is connected with a gate of the PMOS (P3a) and a gate of the NMOS (N3a). A drain of the PMOS (P3a) is connected with a supply node of the second inverter (INV2a) and a drain of the NMOS (N3a) is connected with a ground node of the second inverter (INV2a). The second inverter (INV2a) includes an input connected with a drain of the NMOS (N2a) and the long metal line. An output of the second inverter (INV2a) is connected with a drain of the NMOS (N0a) and a source of a PMOS (P2a). A gate of the NMOS (N2a) is connected with a drain of the PMOS (P2a) and the drain of an NMOS (N1a).

Figure 10:
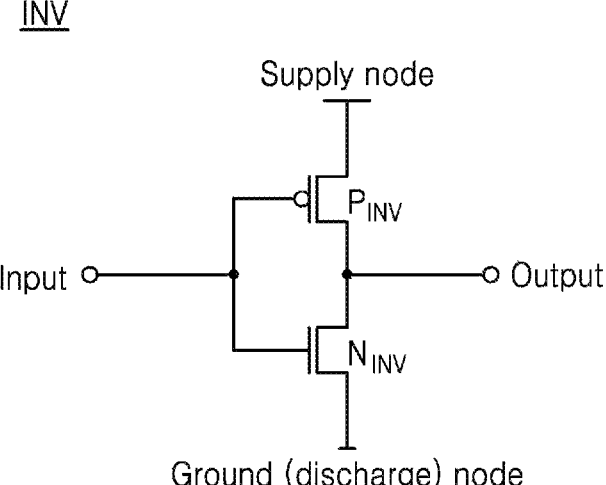
FIG. 10 illustrates a circuit diagram of an inverter that may be used with the signal boosting circuits disclosed herein.

FIG. 10 illustrates an example of an inverter INV that may be used for the inverters disclosed herein, such as INV1, INV2 and INV3. The supply node of an inverter INV provides a positive voltage to the inverter and the ground node provides a lower (e.g., ground voltage) to the inverter INV and may constitute a discharge node. The inverter INV comprises a PMOS transistor PINV and an NMOS transistor NINV having their gates commonly connected as the input of the inverter INV, and their drains commonly connected as the output of the inverter INV. The supply node is connected to the source of the PMOS transistor PINV and the ground node is connected to the source of the NMOS transistor NINV. In operation, the supply node of the inverter INV may receive a supply voltage (to allow the output to be pulled to the supply voltage (e.g., VDD) by PMOS PINV) and/or the ground node of the inverter INV may receive a ground voltage (to allow the output of the inverter INV to be pulled to ground by NMOS NINV). When an appropriate voltage is not provided to the supply node and/or the ground node of the inverter INV, the inverter may not be enabled. For example when the (i) the input to the inverter INV is low but a supply voltage is not provided to the supply node or (ii) the input to the inverter INV is high but a ground voltage is not supplied to the ground node, the output of the inverter INV may not connect to either the supply node or the ground node (and may be floating when no other connection to the output of the inverter provides a signal path to a device voltage source).

In the disclosure, the inverters shown to have inputs to their supply node and ground node, the inputs to the supply node and ground node may not be a constant supply (and thus the inverter status may be one of disabled, partly enabled or fully enabled, depending on the status of the inputs). Inverters shown without inputs to their supply node and ground node may be understood to operate in a fully enabled status (i.e., having their supply node tied to VDD and ground node tied to ground, at least during the relevant operational period of the memory (e.g., when not turned off, not in sleep mode, etc.).

It should be appreciated that although FIG. 3 shows GRBL as separate wires, GRBL constitutes a single electrical node (a single continuous wiring). It should be appreciated that wiring that is shown as separate from one another but identified with the same signal name (e.g., cPCH-GRBL) —in the same or in different figures—may be understood as providing the same electrical signal. Wiring having the same signal name may be formed as a single electrical node (a single continuous wiring). However, in other instances, the same signal may be provided via plural, discrete wirings (e.g., a signal transmitted through two inverters connected in series may generate the same signal at the output as is provided at the input).

As shown in FIGS. 4, 6 and 8, during a read operation, GRBL is precharged at time t0 to a high level (e.g., VDD or 1), and RBL is also similarly precharged to a high level at that time. Control signal PCH_GRBL, input to the signal boosting circuit 210 (210*a*, 210*b*, 210*c*), switches from 0 to 1 at time t1. Referring to FIGS. 3, control signal PCH-_GRBL causes cPCH_GRBL (the inverse of PCH-GRBL) to change from 1 to 0. cPCH_GRBL at 0 enables (switches on) PMOS P3*a* (thus providing a supply voltage to supply node of INV2*b*) and cuts off (switches off) NMOS N3*a*. With respect to FIG. 5, cPCH_GRBL at 0 enables (switches on) PMOS P2*b* (thus providing a supply voltage to supply node of INV2*b*) and cuts off (switches off) NMOS N2*b*.

At time t2, GRBL is connected to a corresponding RBL to sense the data read from a memory cell. At time t2 to t3, the signal boosting circuit 210 senses GRBL and acts to boost the discharge and/or charging of the same. During a read 0 operation, the memory cell provides an output of Qb of 1, pulling RBL to ground (or 0), causing the NAND gate (e.g., 102*a*) to output a 1, switching on transistor M0 to pull GRBL to ground (0) (as shown at time t2).

With respect to the signal boosting circuit 210*a* of FIG. 3, in a read 0 operation at time t2, the PCH_GRBL is 1 to make cPCH_GRBL 0, and thus the PMOS P3*a* is enabled and the NMOS N3*a* is cut off. By virtue of by cPCH_GRBL being high, NMOS N0*a* is turned ON and the PMOS P0*a* is turned OFF. The inverter INV2*a*, whose input is connected to the routed metal line GRBL, senses GRBL fall and thus has its output rise to 1 as the GRBL is discharged. NMOS N2*a* forms a pull down PD circuit of signal boosting circuit 210*a* and is turned on by cPCH_GRBL at 1, and thus connects GRBL to ground, acting so that the signal boosting circuit 210*a* assists in a quick discharge of the GRBL.

Before the GRBL starts to pre-charge (in preparation for the next read operation), PCH GRBL falls at time t3, making cPCH_GRBL 1. Thus, the NMOS N3*a* is turned ON and the PMOS P3*a* is turned OFF. NMOS N1*a*, which is turned on by cPCH_GRBL (at 1) connects the gate of NMOS N2*a* to ground, thereby turning off NMOS N2*a*. cPCH_GRBL (at 1) turns off PMOS P2*a*. At time t4, GRBL rises and the output of inverter INV2*a*, whose input is connected to the long metal line GRBL, falls and PMOS P1*a* turns ON as the GRBL rises, and the PMOS P1*a* pulls the GRBL into 1 acting as a pull up booster circuit. Thus, GRBL may be connected to VDD (1) at a different location, such as at an end of GRBL, adjacent NAND gate 102*a*, etc., and the signal boosting circuit 210*a* may assist in the pull up of GRBL to more quickly precharge PCH_GRBL in preparation for the next read operation.

In the embodiment of FIG. 5, the signal boosting circuit 210*b* includes a gate of the PMOS P0*b* connected with an output of a second inverter INV2*b* and a gate of the NMOS N0*b*. An input of the second inverter INV2*b* is connected to receive cPCH_GRBL output by a first inverter INV1*b* (which receives PCH_GRBL as an input), the drain of the PMOS P0*b* is connected with the source of the PMOS P1*b*. A third inverter INV3*b* has an input of GRBL and has its output connected to the gate of the PMOS P1*b* and the gate of the NMOS N1*b*. The third inverter INV3*b* has a supply node connected to the drain of the PMOS P2*b* and a ground node connected to a drain of the NMOS N2*b*. The gate of the PMOS P2*b* and the gate of the NMOS N2*b* are connected with the output of the first inverter INV1*b*. In an embodiment, the signal boosting circuit 210*b* senses a voltage level of the long metal line GRBL when the signal boosting circuit 210*b* is enabled and the signal boosting circuit 210*a* helps to drive the GRBL to act as a secondary discharge and precharge circuit. The secondary discharge is a PD circuit inside the signal boosting circuit 210*b* including the NMOS N0*b* and the NMOS N1*b*. Similarly, the secondary pre-charge circuit is the PU circuit inside the signal boosting circuit 210*b* including the PMOS P0*b* and the PMOS P1*b*.

With respect to a read 0 operation, control signal PCH-_GRBL, input to the signal boosting circuit 210*b*, switches from 0 to 1 at time t1. Control signal PCH_GRBL causes cPCH_GRBL (the inverse of PCH-GRBL) to change from 1 to 0. cPCH_GRBL at 0 enables (switches on) the PMOS P2*b* (thus providing a supply voltage to supply node of INV2*b*) and cuts off (switches off) the NMOS N2*b*. In a read 0 operation at time t2, PCH_GRBL (at 1) is also provided to the NMOS N0*b* and the PMOS P0*b* (via inverters INV1*b* and INV2*b*) and thus the NMOS N0*b* is turned ON and the PMOS P0*b* is turned OFF. The inverter INV3*b*, whose input is connected to the long metal line GRBL, senses GRBL fall from its precharge state (e.g., 1) to 0 and its output rises to 1 as GRBL is discharged and becomes 0. The output of 1 from INV3*b* is provided to the NMOS transistor N1*b*. The NMOS N0*b* and the NMOS N1*b* (forming a pull down PD circuit) are thus both on and connect GRBL to ground, pulling GRBL to 0. Thus, the PD circuit of signal boosting circuit 210*b* (NMOS N0*b* and NMOS N1*b*) assists in quick discharge of the GRBL.

During a precharge operation of the signal boosting circuit 210*b*, PCH_GRBL falls at time t3 before the GRBL starts to pre-charge making cPCH_GRBL 1, and thus the NMOS N2*a* is turned ON and the PMOS P2*a* is turned OFF. The output of inverter INV2*b* becomes 1 and thus the PMOS P0*b* is turned ON and the NMOS N0*b* is turned OFF. At time t4, GRBL rises and thus the output of inverter INV3 rises, so as to turn ON the PMOS P1*b*. The PMOS P1*b* and the PMOS P0*b*, acting as a pull up boost circuit, pulls the GRBL into 1.

As shown in FIG. 7, the signal boosting circuit 210*c* includes an inverter INV1*c* connected whose output is provided to the gate of NMOS N1*c*. The source of the NMOS N1*c* is connected with the drain of the NMOS N0*c* and the drain of the NMOS N1*c* is connected to GRBL which is also the input of inverter INV1*c*. The gate of the NMOS N0*c* is connected with the gate of the PMOS P1*c*.

The control signal PCH_GRBL is 0 during standby mode at t0 and rises at time t1 before GRBL falls at time t2 during a read operation.

During a read 0 operation, the PCH_GRBL rises at time t2 so that the PMOS transistor P1*c* is turned off, when a memory cell discharges a local bitline RBL, and a NAND gate (e.g., 102*a*) senses it and discharges GRBL (by turning on transistor M0, e.g.), enabling the pull down PD circuit of signal boosting circuit 210*c* to assist in pulling GRBL to ground. Specifically, NMOS N1*c* and NMOS N0*c* form the PD circuit and both are turned on at time t2 to pull GRBL to ground. The inverter INV1*c* of the signal boosting circuit 210*c* senses falling of the GRBL and enables the PD circuit of the signal boosting circuit 210*c* as the GRBL is discharged. The NMOS stack (series connection of NMOS N1*c* and NMOS N0*c*) of the signal boosting circuit 210*c* speeds up GRBL fall transition by discharging it faster.

In the pre-charge operation, the PCH_GRBL falls at the end of read operation (time t4), the PU circuit of the signal boosting circuit 210c is enabled, and GRBL rise transition is speed up by charging it up. Specifically, PCH_GRBL at 0 runs on PMOS P1c connecting GRBL to VDD (1) to precharge GRBL to VDD (1).

Thus, when the PCH_GRBL is low at an end of a read operation, a PD path of signal boosting circuit 210c is disabled, and a PU circuit is enabled. In another embodiment, when the PCH_GRBL is high at a beginning of the read operation, a PU path of the signal boosting circuit 210c is disabled and the PD circuit is enabled.

FIG. 9 is a flow chart (900) illustrating a method for reducing impact of the parasitic wire RC in the memory device, according to an embodiment as disclosed herein.

At 902, the method includes sensing one of the rise transition and the fall transition in the long metal line using the control signal and the sense circuit. The sense circuit is part of the signal boosting circuit (e.g., 210a-210c). At 904, the method includes enabling one of the PU circuit and the PD circuit to speed-up one of the rise transition and the fall transition in the long metal line. At least one of the PU circuit and the PD circuit is part of the signal boosting circuit (210a-210c). At 906, the method includes controlling the duration of an operation of one of the PU circuit and the PD circuit using the control signal (e.g. PCH-GRBL), when there is no transition in the long metal line is detected.

The method can be used to improve the discharge/precharge time of GRBL using the signal boosting circuit (210a-210c).

The various actions, acts, blocks, steps, or the like in the flow chart (900) may be performed in the order presented, in a different order or simultaneously. Further, in some embodiments, some of the actions, acts, blocks, steps, or the like may be omitted, added, modified, skipped, or the like without departing from the scope of the invention.

The foregoing description of the specific embodiments will so fully reveal the general nature of the invention herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed invention. It is to be understood that the phraseology or terminology employed herein is for the purpose of description and not of limitation. Therefore, while the invention herein have been described in terms of embodiments, those skilled in the art will recognize that the invention herein can be practiced with modification of the disclosed embodiments.

We claim:

1. A method for transmitting a data bit in a memory device, comprising:
 sensing at least one of a rise transition and a fall transition of a signal transmitted by a signal line using a control signal and a sense circuit of a signal boosting circuit;
 enabling at least one of a Pull Up (PU) circuit and a Pull Down (PD) circuit to speed-up one of the rise transition and the fall transition of the signal transmitted by the signal line, wherein the at least one of the PU circuit and the PD circuit is part of the signal boosting circuit; and
 providing the control signal to the signal boosting circuit to control the duration of an operation of the at least one of the PU circuit and the PD circuit,
 wherein the enabling of the at least one of the PU circuit and the PD circuit to speed-up one of the rise transition and the fall transition of the signal transmitted by the signal line, includes:

enabling the PD circuit to speed-up the fall transition of the signal transmitted by the signal line in response to the signal of the signal line being discharged and the control signal.

2. The method as claimed in claim 1,
 wherein the signal line is a Global Read Bit Line (GRBL), a WordLine (WL), a Bitline (BL), a Clock Signal (CLK) line, a Pre-charge signal (PCH) line, or a sense enable signal (SAEN) line, and
 wherein the signal boosting circuit is connected to the signal line.

3. The method as claimed in claim 1,
 wherein the signal line is a Global Read Bit Line (GRBL) and is provided as an input to the signal boosting circuit,
 wherein the signal boosting circuit comprises an input of the control signal, and
 wherein the control signal controls a duration for which boosting of the signal transmitted by the GRBL is boosted by the signal boosting circuit.

4. The method as claimed in claim 3, wherein the signal boosting circuit comprises:
 four p-channel metal-oxide semiconductor (PMOS) transistors P0, P1, P2 and P3;
 four n-channel metal-oxide semiconductor (NMOS) transistors N0, N1, N2 and N3; and
 first and second inverters,
 wherein P0 comprises a drain connected with a gate of P1,
 wherein a gate of P0 is connected with a gate of N0,
 wherein the gate of P1 is connected with a drain of N0,
 wherein the first inverter receives as an input the control signal and provides an inverted control signal as an output,
 wherein an output of the first inverter is connected to a gate of P3 and a gate of N3,
 wherein a drain of P3 is connected with a supply node of the first inverter and a drain of N3 is connected with a ground node of the first inverter,
 wherein the second inverter includes an input connected with a drain of N2, a drain of P1 and the signal line,
 wherein an output of the second inverter is connected with a source of N0 and a source of P2, and
 wherein a gate of N2 is connected with a drain of P2 and a drain of N1.

5. The method as claimed in claim 4, wherein the signal boosting circuit senses a voltage level of the signal line and assists in driving the signal line as a secondary discharge and pre-charge circuit.

6. The method as claimed in claim 4, wherein during a read operation,
 the control signal rises to make the inverted control signal output by the first inverter have a logic low, which causes P2 to be turned on to connect the output of the second inverter to the gate of N2,
 the second inverter senses GRBL fall and has its output rise to a logic high as GRBL is discharged, and
 the output of the second inverter is connected to the gate of N2 via P2 causing N2 to be turned on and connect GRBL to ground to assist in discharging of GRBL.

7. The method as claimed in claim 4, wherein the method further comprises the signal boosting circuit performing a pre-charge operation of GRBL comprising:
 the control signal falling to a logic low before GRBL starts to pre-charge causing the inverted control signal output by the first inverter have a logic high;
 turning on N1, N0 and N3, and turning off P2 and P3;

by turning on N1, connecting the gate of N2 to logic low to turn off N2 thereby disconnecting a discharge path from GRBL to a discharge node;

providing the output of the second inverter to the gate of P1 through N0; and as the GRBL rises, P1, acting as a pull up booster circuit, turns on to pull the GRBL into a logic high.

8. The method as claimed in claim 1, wherein the signal boosting circuit comprises:

three p-channel metal-oxide semiconductor (PMOS) transistors P0, P1 and P2;

two n-channel metal-oxide semiconductor (NMOS) transistors N0 and N1; and first, second and third inverters, wherein the signal line is a Global Read Bit Line (GRBL) and is provided as an input to the signal boosting circuit, wherein an output of the second inverter is connected to a gate of P0 and a gate of N0, wherein an input of the first inverter receives the control signal as an input, wherein an input of the second inverter is connected with an output of the first inverter to provide an inverted control signal from the first inverter to the second inverter, wherein a drain of P0 is connected with a source of P1, wherein an output of the third inverter is connected to a gate of P1 and a gate of N1, wherein a drain of P2 is connected with a supply node of the third inverter, and wherein the output of the first inverter is connected to a gate of P2 and a gate of N2.

9. The method as claimed in claim 8, wherein during a read operation, the control signal rises to make the inverted control signal output by the first inverter into a logic low, which causes N0 and P2 to be turned on and P0 and N2 to be turned off, the third inverter senses GRBL fall and has its output rise to a logic high as GRBL is discharged, and the output of the third inverter being provided to the gate of N1 causes N1 to turn on to pull down GRBL through N0 and N1, such that N0 and N1 act a signal booster to assist in discharging of GRBL.

10. The method as claimed in claim 8, wherein the method further comprises the signal boosting circuit performing a pre-charge operation of GRBL comprising:

the control signal falling to a logic low before GRBL starts to pre-charge causing the inverted control signal output by the first inverter have a logic high;

turning on N2 and P0 and turning off P2 and N0;

as GRBL rises, turning on P1; and

P0 and P1, acting as a pull up booster circuit, pulling GRBL into a logic high.

11. The method as claimed in claim 1, wherein the signal boosting circuit comprises:

a p-channel metal-oxide semiconductor (PMOS) transistor P1 as the PU circuit;

two n-channel metal-oxide semiconductor (NMOS) transistors N0 and N1 as the PD circuit; and an inverter, wherein the signal line is a Global Read Bit Line (GRBL) and is provided as an input to the signal boosting circuit, wherein an output of the inverter is connected with a gate of N1, wherein a source of N1 is connected with a drain of N0, wherein GRBL is connected to a drain of N1 and an input of the inverter, and wherein the control signal is connected to a gate of N0 and a gate of P1.

12. The method as claimed in claim 11, wherein during a read operation, the control signal rises to turn off P1 and to turn on N0, local reading of a memory cell discharges a local bitline which is sensed by a NAND gate whose output initiates a discharge of GRBL, and the inverter senses GRBL fall and enables the PD circuit of the signal boosting circuit such that GRBL is discharged by combination of the discharge initiated by the NAND gate and the PD circuit of the signal boosting circuit.

13. A memory device comprising:

a signal line; and a signal boosting circuit connected to the signal line to assist in at least one of charging or discharging of the signal line, wherein the signal boosting circuit is configured to:

sense at least one of a rise transition and a fall transition of a signal transmitted by the signal line using a control signal and a sense circuit of the signal boosting circuit, enable at least one of a Pull Up (PU) circuit and a Pull Down (PD) circuit to speed-up one of the rise transition and the fall transition of the signal transmitted by the signal line, wherein the at least one of the PU circuit and the PD circuit is part of the signal boosting circuit, and in response to the control signal provided to the signal boosting circuit, control the duration of an operation of the at least one of the PU circuit and the PD circuit, and wherein, in response to the signal of the signal line being discharged and the control signal, the signal boosting circuit is configured to enable the PD circuit to speed-up the fall transition of the signal transmitted by the signal line.

14. The memory device as claimed in claim 13, wherein the signal boosting circuit comprises:

four p-channel metal-oxide semiconductor (PMOS) transistors P0, P1, P2 and P3;

four n-channel metal-oxide semiconductor (NMOS) transistors N0, N1, N2 and N3; and first and second inverters, wherein P0 comprises a drain connected with a gate of P1, wherein a gate of P0 is connected with a gate of N0, wherein the gate of P1 is connected with a drain of N0, wherein the first inverter is configured to receive as an input the control signal and provide an inverted control signal as an output, wherein an output of the first inverter is connected to a gate of P3 and a gate of N3, wherein a drain of the P3 is connected with a supply node of the first inverter and a drain of the N3 is connected with a ground node of the first inverter, wherein the second inverter includes an input connected with a drain of N2, a drain of P1 and the signal line, wherein an output of the second inverter is connected with a source of N0 and a source of P2, and wherein a gate of N2 is connected with a drain of P2 and a drain of N1.

15. The memory device as claimed in claim 13, wherein the signal boosting circuit comprises:

three p-channel metal-oxide semiconductor (PMOS) transistors P0, P1 and P2;

two n-channel metal-oxide semiconductor (NMOS) transistors N0 and N1; and first, second and third inverters, wherein the signal line is a Global Read Bit Line (GRBL) and is provided as an input to the signal boosting circuit, wherein an output of the second inverter is connected to a gate of P0 and a gate of N0, wherein an input of the first inverter is configured to receive the control signal as an input, wherein an input of the second inverter is connected with an output of the first inverter to provide an inverted control signal from the first inverter to the second inverter, wherein a drain of P0 is connected with a source of P1, wherein an output of the third inverter is connected to a gate of P1 and a gate of N1, wherein a drain of P2 is connected with a supply node of the third inverter, and wherein the output of the first inverter is connected to a gate of P2 and a gate of N2.

16. The memory device as claimed in claim 15, wherein during a read operation, the signal boosting circuit is configured to:

in response to the control signal rising, make the inverted control signal output by the first inverter into a logic low, which causes N0 and P2 to be turned on and P0 and N2 to be turned off, as GRBL is discharged, have the output of the third inverter rise to a logic high as the third inverter senses GRBL fall, and have the output of the third inverter being provided to the gate of N1 cause N1 to turn on to pull down GRBL through N0 and N1, such that N0 and N1 act a signal booster to assist in discharging of GRBL.

17. The memory device as claimed in claim 15, wherein during a pre-charge operation of GRBL, the signal boosting circuit is configured to:

in response to the control signal falling to a logic low before GRBL starts to pre-charge, cause the inverted control signal output by the first inverter have a logic high, turn on N2 and P0 and turn off P2 and N0, as GRBL rises, turn on P1, and P0 and P1, acting as a pull up booster circuit, pull GRBL into a logic high.

18. The memory device as claimed in claim 13, wherein the signal boosting circuit comprises:

a p-channel metal-oxide semiconductor (PMOS) transistor P1 as the PU circuit;

two n-channel metal-oxide semiconductor (NMOS) transistors N0 and N1 as the PD circuit; and an inverter, wherein the signal line is a Global Read Bit Line (GRBL) and is provided as an input to the signal boosting circuit, wherein an output of the inverter is connected with a gate of N1, wherein a source of N1 is connected with a drain of N0, wherein GRBL is connected to a drain of N1 and an input of the inverter, and wherein the control signal is connected to a gate of N0 and a gate of P1.

19. The memory device as claimed in claim 18, further comprising:

a memory cell array;

a local bit line operably connected to the memory cell array, and configured to sense data of a memory cell of the memory cell array; and a NAND gate operably connected to the local bit line and GRBL to initiate a discharge of the GRBL in response to sensing a logic level of the local bit line, wherein during a read operation, the signal boosting circuit is configured to:

turn off P1 of the PU circuit and turn on N0 of the PD circuit in response to the control signal rising, and in response to the inverter sensing GRBL fall, enabling N1 of the PD circuit of the signal boosting circuit such that GRBL is discharged by combination of the discharge initiated by the NAND gate and the PD circuit of the signal boosting circuit.

20. The memory device as claimed in claim 18, wherein during a pre-charge operation of GRBL the signal boosting circuit is configured to:

in response to the control signal falling to a logic low at an end of a read operation, enable P1 of the PU circuit of the signal boosting circuit to pull up GRBL.

* * * * *